(12) United States Patent
Wu

(10) Patent No.: US 6,603,467 B1
(45) Date of Patent: Aug. 5, 2003

(54) METHOD AND APPARATUS FOR LCD PANEL POWER UP TEST

(75) Inventor: Chi-Yuan Wu, Shengang Shiang (TW)

(73) Assignee: Industrial Technologies Research Institute, Hsin Chu (TW)

( * ) Notice: Subject to any disclaimer, the term of this patent is extended or adjusted under 35 U.S.C. 154(b) by 327 days.

(21) Appl. No.: 09/679,254

(22) Filed: Oct. 4, 2000

(51) Int. Cl.[7] .................................................. G09G 5/00
(52) U.S. Cl. ...................... 345/204; 345/904; 438/151; 324/770; 204/403.01
(58) Field of Search ................................. 345/904, 204; 324/538, 537, 770; 438/151, 156, 160

(56) References Cited

U.S. PATENT DOCUMENTS

| | | | | |
|---|---|---|---|---|
| 5,623,211 A | * | 4/1997 | Lee | 324/538 |
| 6,150,833 A | * | 11/2000 | Lin et al. | 324/770 |
| 6,297,080 B1 | * | 10/2001 | Lee et al. | 438/151 |

* cited by examiner

*Primary Examiner*—Amare Mengistu
(74) *Attorney, Agent, or Firm*—Tung & Associates

(57) ABSTRACT

A power up test method and apparatus for a liquid crystal display (LCD) panel are disclosed. A power up test panel is used to perform the power up test on a LCD panel which greatly simplifies the test and reduces cost. The power up test panel includes a plurality of test electrodes formed on a substrate. The plurality of test electrodes corresponds one-on-one to a plurality of input electrodes on the LCD panel. The power up test panel makes electrical communication with a host system circuit which generates driving signals for sending to the power up test panel through a flexible film. During the power up test, the electrodes on the power up test panel and the input electrodes are matched and a pressure is applied for performing the electrical signal communication test of the LCD panel. The method is particularly suitable for the power up test of a high resolution LCD panel which has small pitch distance between input electrodes.

14 Claims, 3 Drawing Sheets

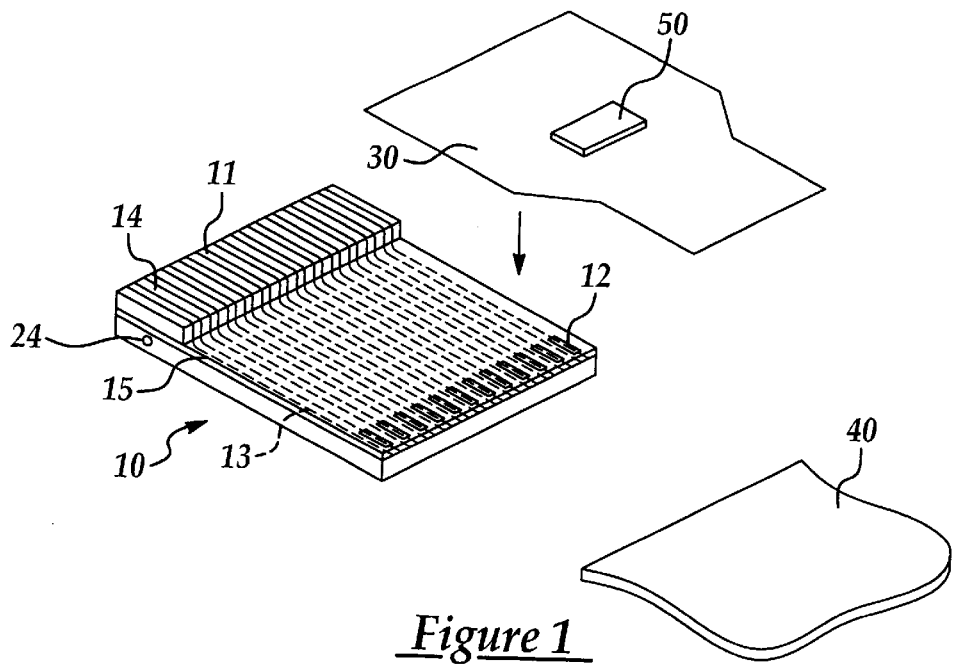
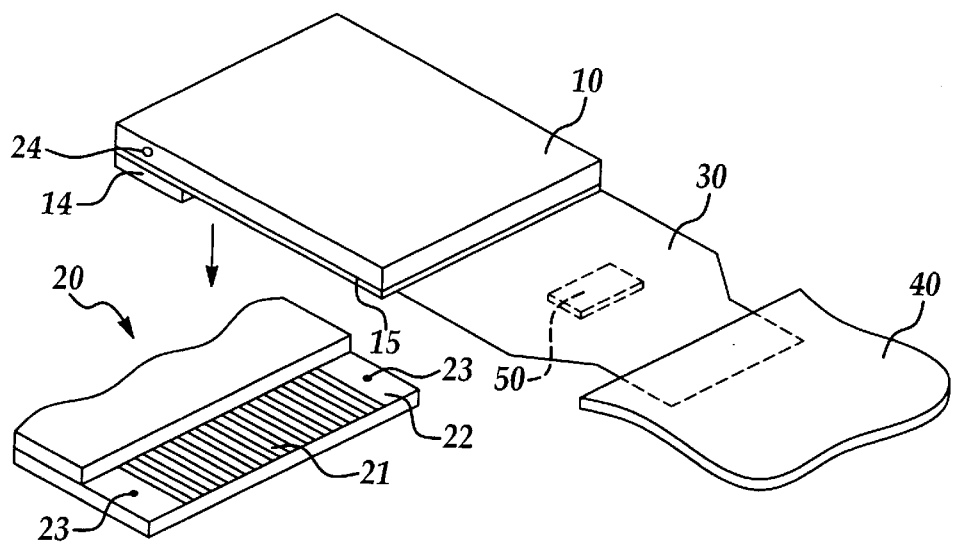

METHOD AND APPARATUS FOR LCD PANEL POWER UP TEST

FIELD OF THE INVENTION

The present invention generally relates to a method and apparatus for LCD panel power up test and more particulary, to an apparatus for power up test a LCD panel equipped with a plurality of test electrodes for connecting to a plurality of input electrodes on the LCD panel, and a method for conducting the test.

RELATED ART

LCD panels have been widely used in desktop computers, notebook computers and other electronic devices. Along the edge portion of a glass plate of a LCD panel is provided an electrode terminal, which is usually connected to a host system circuit by electrical wires encapsulated in a flexible film for providing electrical communications between the electrode terminal and the host system circuit. The flexible film can be a flexible printed circuit (FPC) or a tape. The output signals from the host system circuit are first processed by a driver-integrated circuit (IC) and then sent to the electrode terminal for driving the pixels on the LCD panel. The driver IC, for example, can be mounted on a tape carrier of a TAB (Tape Automated Bonding) system with the input leads of the tape carrier connect the driver IC to the host system circuit, and the output leads connect the driver IC to the electrode terminal. The electrode terminal and the host system circuit are thus in signal communication through the tape carrier.

After the LCD panels are fabricated and before they are sent to a liquid crystal monitor (LCM) module for driver IC packaging and system linking, the panels are tested in a power up test for turning on the pixels of the panel to ensure that the panels function properly. The LCD panel must pass the power up test before it is packaged with driver IC. Since a high resolution LCD panel has closely spaced input electrodes in the electrode terminal, i.e., a small pitch between the electrodes, conventional method for performing the power up test by using a probe to contact the input electrodes is extremely difficult to carry out. Moreover, the test apparatus is difficult to fabricate.

Accordingly, there is a need for providing a new method for power up testing for a LCD panel.

SUMMARY OF THE INVENTION

It is an object of the present invention to provide a LCD panel power up test method and apparatus which can be used easily and at a low cost.

Pursuant to the above object, the present invention uses a power up test panel to test a LCD panel. The power up test panel includes a plurality of test electrodes for connecting to a plurality of input electrodes on an electrode terminal of the LCD panel.

In a preferred embodiment, a power up test panel includes a glass substrate and a plurality of test electrodes formed on the glass substrate. Each of the test electrodes corresponds to one of the plurality of input electrodes on the LCD panel. When carrying out the power up test, the power up test panel and the electrode terminal of the LCD panel are matched together and a pressure is applied thereon so that each of the test electrodes is in electrical communication with a corresponding input electrode on the LCD panel. The power up test panel further includes a first connecting wire and a circuit terminal formed on the glass substrate wherein the first connecting wire connects the test electrode to the circuit terminal such that the circuit terminal may communicate with an outside circuit. A second connecting wire on a flexible film can be used to connect the circuit terminal to a host system circuit. The flexible film with the second connecting wire may be a flexible printed circuit (FPC) or a tape.

The host system circuit may include a driver IC for processing signals from the host system circuit and for outputting signals to the power up test panel through the second connecting wire.

The driver IC is preferably installed on a flexible film to process signals received from the host system circuit. The assembly of the driver IC on the flexible film can be achieved by using a chip on film (COF) or TAB package.

The driver IC can also be assembled on the power up test panel for processing signals received from the host system circuit. The driver IC can be assembled on the power up test panel by using the chip on glass (COG) technology.

Pursuant to the object of the present invention, the power up test panel which has a plurality of test electrodes can be fabricated by the following steps: (1) depositing a metal layer on a substrate and patterning a circuit thereon; (2) depositing an insulating layer on the metal layer and the substrate and forming a pattern thereon to produce appropriate contact windows; (3) depositing a photoresist layer on the insulating layer and the metal layer and forming a pattern in the photoresist layer to expose an area for forming the test electrodes; (4) depositing a photo-sensitive polyimide (PSPI) layer on the photoresist layer, the insulation layer and the metal layer and patterning the PSPI layer to expose the metal circuit in the area for forming the test electrodes; (5) forming the test electrodes by depositing metal bumps on the exposed metal circuit; and (6) stripping the photoresist layer.

The substrate for forming the test panel may be a glass substrate. The formation of the test electrodes on the exposed metal circuit can be achieved by electrical plating.

The scope of applicability of the present invention will become apparent from the detailed description given hereinafter. It should be understood that the detailed description and the specific examples, while illustrating the preferred embodiments of the invention, are given by way of illustration only, various changes and modifications within the spirit and scope of the invention will become apparent to those skilled in the art from the following detailed description.

BRIEF DESCRIPTION OF THE DRAWINGS

The present invention will become more fully understood from the detailed description and the appended drawings wherein:

FIG. 1 is a perspective view of the present invention power up test apparatus.

FIG. 2 is a perspective view of the power up test panel, the connecting flexible film (tape) with a driver IC packaged thereon;

DETAILED DESCRIPTION OF THE INVENTION

Figure 3A:
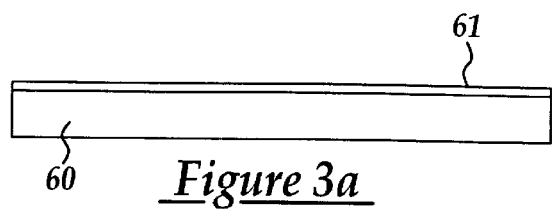
FIGS. 3a through 3g depict fabrication steps for the preferred embodiment of the power up test panel of the invention.

Referring initially to FIGS. 1 and 2, which show a preferred embodiment power up test method for an LCD panel according to the present invention. The power up test panel 10 includes plurality of test electrodes 11 and a circuit terminal 12. The plurality of test electrodes 11 preferably protrudes from the test panel and corresponds one-on-one to a plurality of input electrodes 22 in an electrode terminal 21 of a LCD panel 20. Both sides of the test electrode 11 can be formed with a photo-sensitive polyamide (PSPI) layer 14 for protecting the test electrode 11 from distortion under pressure. The test electrode 11 connects to the circuit terminal 12 through a first connecting wire 13. An insulating layer 15 of a proper pattern can be formed on the first connecting wire 13 for protecting the wiring.

The circuit terminal is in electrical communications with a host system circuit 40 through a second connecting wire on a flexible film 30. The flexible film 30, for example, is a tape and has a driver IC 50 embedded by, for example, a TAB packaging. The driver IC 50 is used to process the signals from the host system circuit 40 and to output the signals to the power up test panel 10. The flexible film 30 and the driver IC 50 installed thereon may also be packaged using the chip on film (COF) technology.

When carrying out the power up test, the test electrode 11 of the power up test panel 10 is matched with the electrode terminal 21 on the LCD panel 20 by using a CCD optical system (not shown) and alignment marks 23, 24. A proper pressure is applied so that the test electrodes 11 and the input electrodes 22 are in one-on-one contact for performing the power up test.

Figure 3B:
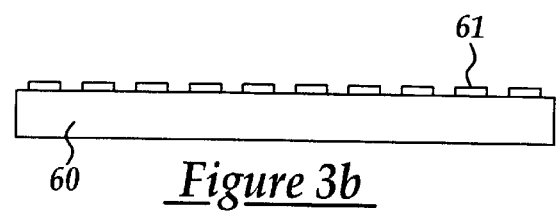

FIGS. 3a through 3g depict a preferred embodiment method for fabricating the power up test panel 10. First, as shown in FIG. 3a, a substrate 60, e.g., a glass substrate, is coated with a meal layer 61 by sputtering. A circuit pattern is then formed on the metal layer 61 as shown in FIG. 3b.

Figure 3C:
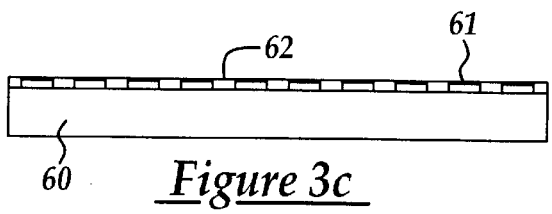
Figure 3D:
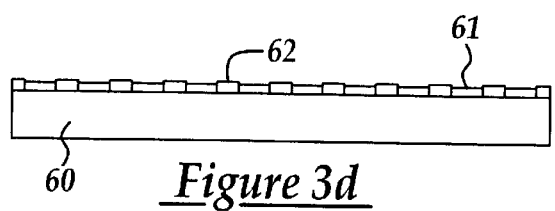

Referring now to FIG. 3c wherein the metal layer 61 and the substrate 60 are covered by an insulation layer 62 by sputtering or vapor deposition. The insulation layer 62 is then patterned, as shown in FIG. 3d, so as to expose a circuit or contact windows. For instance, the circuit of the position for the test electrodes 11 and the circuit of the position for the circuit terminal 12 are exposed during this step.

Figure 3E:
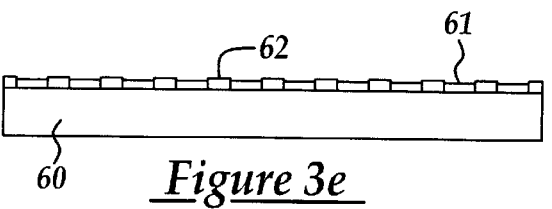
Figure 4:
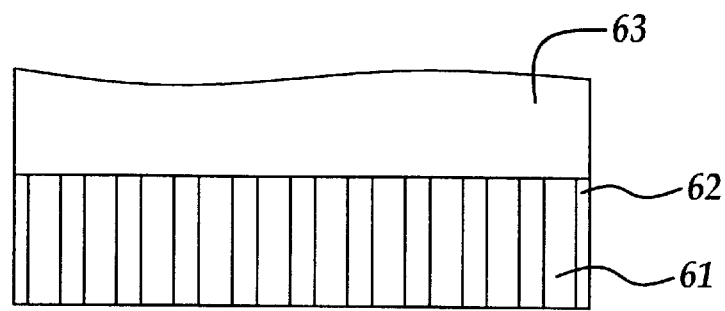
FIG. 4 is a plane view of FIG. 3e.

With reference to FIG. 3e and FIG. 4, a photoresist layer 63 is coated on the insulating layer 62 and the metal layer 61. The photoresist layer 63 is patterned to expose the area for the test electrodes 11.

Figure 3F:
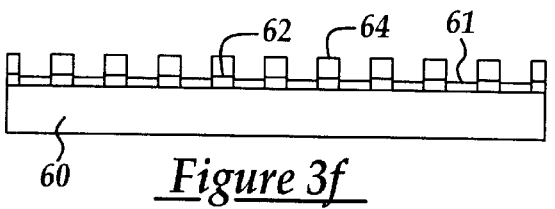

As shown in FIG. 3f, the photoresist layer 63, the insulation layer 62 and the metal layer 61 are coated with a PSPI layer 64, which is further patterned to expose a metal circuit for forming the test electrodes 11.

Figure 3G:
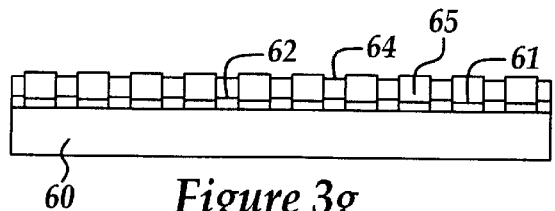

Finally, as shown in FIG. 3g, Ni, Au, or Cu is coated on the exposed metal 61 by electrical plating to form the test electrodes 11. The test electrodes 11 are preferably formed to be slightly higher than the PSPI layer 64. After stripping the photoresist layer 63, the power up test panel 10 is completed.

Figure 5:
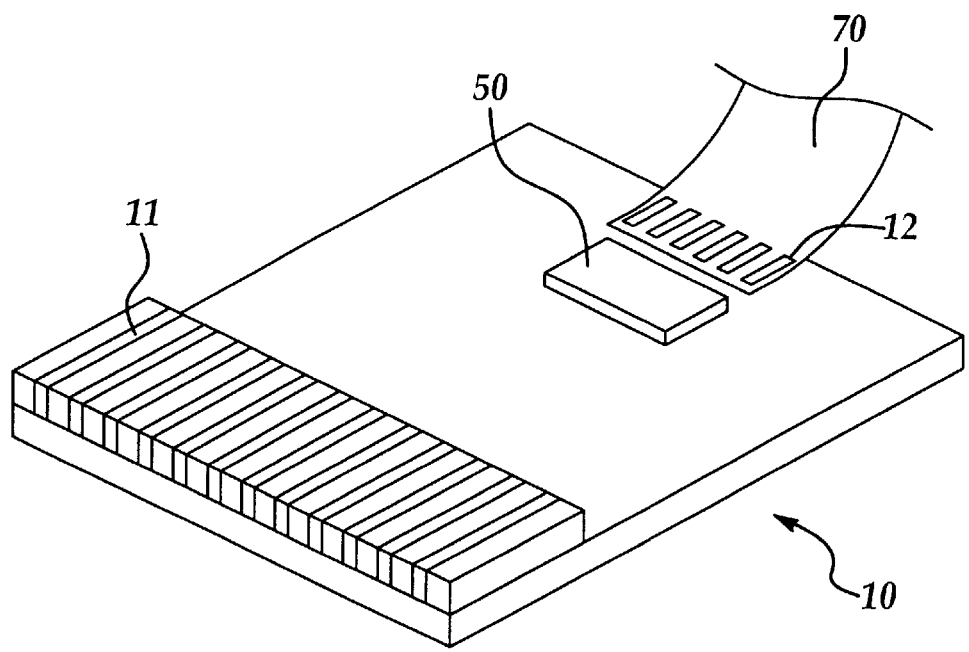
FIG. 5 is a perspective view of a present invention power up test panel, a connecting flexible film along with a driver IC packaged on the power up test panel.

The driver IC 50 can be assembled on the flexible printed circuit 40 or can be packaged on the power up test panel 10, as in FIG. 5. The driver IC 50 can be embedded on the power up test panel 10, between the circuit terminal 12 and the test electrode 11, using a COG packaging technology. The circuit terminal 12 is in electrical communications with the host system 40 through a flexible printed circuit 70. The connection between the flexible printed circuit 70 and the host system 40 can be achieved, for example, using a connector (not shown). Therefore, signals from the host system 40 can be input-fed into the circuit terminal 12 through the flexible printed circuit, processed by the driver IC 50 and then output-fed to the test electrodes 11.

The invention being thus described, it is obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for power up testing an LCD panel by using a power up test panel wherein the panel comprises a plurality of test electrodes for contacting a plurality of input electrodes of an electrode terminal on the LCD panel, the method comprising the steps of:

depositing a metal layer on a substrate and patterning the metal layer to form a circuit terminal;

depositing an insulating layer on the metal layer and the substrate and patterning the insulation layer exposing contact windows;

depositing a photoresist layer on the insulating layer and the metal layer and patterning the photoresist layer to expose an area for forming the plurality of test electrodes;

depositing a photo-sensitive polyimide (PSPI) layer on the photoresist layer, the insulating layer and the metal layer, and patterning the PSPI layer to expose metal portions of said area;

forming the plurality of test electrodes on the exposed metal portions;

connecting each of the plurality of test electrodes to one of the plurality of input electrodes using a first connecting wire;

connecting the circuit terminal to a host system circuit using a second connecting wire for providing signal communication therein between; and performing the power up test by connecting each of the plurality of test electrodes on the power up test panel to one of the plurality of input electrodes on the LCD panel.

2. The method of claim 1, wherein said substrate is a glass substrate.

3. The method of claim 1 further comprising the step of forming a photo-sensitive polyimide (PSPI) layer on both sides of each test electrode on the substrate.

4. The method of claim 1 further comprising the step of packaging a driver IC on the power up test panel.

5. The method of claim 1, wherein the second connecting wire is formed in a flexible film.

6. The method of claim 5, wherein a driver IC is packaged on the flexible film.

7. The method of claim 5, wherein the flexible film is a tape.

8. The method of claim 5, wherein the flexible film is a flexible printed circuit.

9. A method for making a power up test panel for an LCD panel power up test wherein the power up test panel having a plurality of test electrodes for contacting a plurality of input electrodes of an electrode terminal on the LCD panel, the method comprising the steps of:

depositing a metal layer on a substrate and patterning the metal layer to form a circuit pattern;

depositing an insulating layer on the metal layer and the substrate and patterning the insulation layer exposing contact windows;

depositing a photoresist layer on the insulating layer and the metal layer and patterning the photoresist layer to expose an area for forming the plurality of test electrodes;

depositing a photo-sensitive polyimide (PSPI) layer on the photoresist layer, the insulating layer and the metal layer, and patterning the PSPI layer to expose metal portions of said area;

forming the plurality of test electrodes on the exposed metal portions; and stripping the photoresist layer.

10. The method of claim 9, wherein the substrate is a glass substrate.

11. The method of claim 9, wherein the step of forming the plurality of test electrodes further comprises the step of forming the plurality of test electrodes on the exposed metal portions by electroplating.

12. A power up test panel for performing a power up test on an LCD panel, comprising:

a substrate equipped with a plurality of test electrodes each corresponds one-on-one to an input electrode in an electrode terminal of the LCD panel;

a photo-sensitive polyimide (PSPI) layer formed on both sides of each of the plurality of test electrodes;

a circuit terminal on the substrate for providing electrical communications with an outside circuit; and a connecting wire formed on the substrate for connecting the plurality of test electrodes to the circuit terminal.

13. The structure of claim 12, wherein the substrate is a glass substrate.

14. The structure of claim 12 further comprising a driver IC packaged on the substrate for signal processing.

\* \* \* \* \*